United States Patent [19]

Maki

[11] Patent Number: 4,646,680

[45] Date of Patent: Mar. 3, 1987

[54] CRUCIBLE FOR USE IN MOLECULAR BEAM EPITAXIAL PROCESSING

[75] Inventor: Paul A. Maki, Acton, Mass.

[73] Assignee: General Electric Company, Syracuse, N.Y.

[21] Appl. No.: 812,461

[22] Filed: Dec. 23, 1985

[51] Int. Cl.$^4$ ............................................. C23C 16/00
[52] U.S. Cl. ...................................... 118/726; 118/727; 156/DIG. 83; 156/DIG. 103
[58] Field of Search ................. 118/726, 727; 156/DIG. 83, DIG. 103; 422/247, 248

[56] References Cited

U.S. PATENT DOCUMENTS

| 4,181,544 | 1/1980 | Cho | 156/DIG. 103 |
| 4,352,784 | 10/1982 | Lin | 156/DIG. 83 |
| 4,569,829 | 2/1986 | Shih | 118/726 |

FOREIGN PATENT DOCUMENTS

| 0126262 | 4/1978 | Japan | 156/DIG. 103 |
| 0197270 | 11/1983 | Japan | 118/726 |
| 0054696 | 3/1984 | Japan | 156/DIG. 103 |

*Primary Examiner*—John D. Smith
*Assistant Examiner*—Vi Duong Dang
*Attorney, Agent, or Firm*—Richard V. Lang; Carl W. Baker

[57] ABSTRACT

A crucible is disclosed for use in molecular beam epitaxial processing exhibiting low flux transient behavior as shutters of individual furnaces are opened to initiate the process and with excellent flux uniformity over the surface being processed and over the processing time. The crucible is designed for liquid melts of Group III metals, including Gallium, Indium, and Aluminum.

The crucible comprises a two member construction in which the outer member, which contains the melt, is typically cylindrical and of maximum capacity consistent with the furnace interior, and an inner member having a conical configuration with a small aperture at the bottom for optimum molecular beam formation. The conical member increases the thermal impedance between the melt surface and the interior of the MBE system to reduce the flux transient and increases the uniformity of the molecular beam over the area being processed, and over the time that the process is being conducted.

5 Claims, 7 Drawing Figures

CRUCIBLE FOR USE IN MOLECULAR BEAM EPITAXIAL PROCESSING

BACKGROUND OF THE INVENTION

1. Field of the Invention

The invention relates to molecular beam epitaxial (MBE) processing and to means for MBE processing. More particularly the invention relates to the provision of beam forming material and beam formation and to a novel crucible by which the beam formation material is provided, and which creates the molecular beam.

2. Prior Art

In a molecular beam epitaxial system, a plurality of materials are disposed in furnaces to form effusion cells in proximity to a semiconductor wafer. In the MBE process an epitaxial layer is formed on the wafer, whose composition is controlled by the simultaneous operation of two to four effusion cells. The simultaneous operation produces an epitaxial layer having suitable properties for the formation of semiconductor devices and circuits. The process is conducted in a vacuum, with both the substrate and the material from which the molecular beam is formed being operated at elevated temperatures. The substrate is operated at an elevated temperature suitable for epitaxial growth, 600 degrees C. being suitable for gallium arsenide substrates.

The growth material is supplied by the effusion cells, for which the furnaces provide the necessary heat to achieve a desired level of effusion. Within the furnaces, it is conventional to employ inert crucibles, which contain the effusion material. In the case of the growth of gallium arsenide epitaxial layers separate crucibles are provided for gallium, which liquifies at relatively low temperature, for arsenic and for each other material used. Other materials such a silicon may be used to establish the "doping" levels, and thereby the conductivity of the resultant epitaxial layer.

In the physical arrangement, the effusion process entails growth materials which are both solid and liquid at the temperatures required to provide adequate effusion flux. The crucibles accordingly differ in design dependent on the operating position within the MBE system and on whether the material is liquid or solid during effusion.

Gallium, one of several materials that are important in epitaxial processing, is a liquid at effusion temperatures. Other Group III metals such as Indium, Gallium, or Aluminium, also require a crucible suitable for a liquified charge.

The criteria of a good crucible design come from the operational requirements. The crucible, given the limited spatial constraints of available MBE furnaces, should have a large melt capacity to reduce the frequency of recharging.

In the effusion process, the crucible should produce a beam which is uniform across its cross-section to support the formation of epitaxial layers of uniform thickness and constitution over the surface of the wafer.

In addition, since the processing requires the facility to make thin, reproducible layers, the crucible should permit accurate temporal control. In relation to reproducibility, the conventional means of initiation and terminating the effusion is by a mechanical shutter in proximity to the crucible. Operating the shutter effects a change in the temperature at the surface of the charge. This occurs because the shutter changes the radiative shielding of the charge in the crucible. The result is that upon opening the shutter, the initial effusion rate is excessive and eventually stabilizes at a lower value. Accordingly, an objective is a crucible design in which the melt temperatures—which control the rate of effusion—are insensitive to changes in the radiative shielding at the crucible orifice.

Group III melts the usually contained in pyrolitic boron nitride (PBN) crucibles of various shapes and sizes. The basic concepts of crucible design for achieving uniform deposition over 2 or 3 inch diameter wafers are well understood (see K. Ploog, "Molecular Beam Epitaxy of III-V Compounds", "Crystal Growth Properties and Applications", 1980, Vol. 3, Springler-Verlag; and P. E. Luscher and D. M. Collins, "Design Considerations for Molecular Beam Epitaxy Systems", "Progress in Crystal Growth and Characterization", 1979, Vol. 2, pp. 15-32, Pergamon Press Ltd.). Unfortunately for many of these cell configurations the melt temperature is affected by the radiation shielding provided by the beam shutter. A flux transient typically lasting one to three minutes occurs when the shutter is opened and the cell establishes a new equilibrium temperature.

Group III flux transients in MBE growth limit film reproducibility as well as being an inconvenience to the MBE user. Short term flux transients cause poor control over growth stoichiometry and uncertainty over initial growth rates. Control of growth rates during the first few minutes after shutter opening is important for the reproducible growth of such submicron structures as the high electron mobility transistor.

Present crucible designs provide either excellent uniformity and large flux transients or poor uniformity with small flux transients. Uniformity of molecular beam patterns depends on the source to substrate spacing and the angular flux distribution at the source. The best uniformity is obtained with a large source to substrate spacing and an emitting flux distribution at the cell orifice which is isotropic in the solid angle subtended by the substrate.

A known conically shaped crucible, shown in FIG. 2A, has these flux characteristics as well as a large cell orifice for high flux density. Flux uniformity at the source is attained by allowing a direct path to the entire substrate from each point on the melt surface. The atoms which escape the crucible without wall collisions are the main component of the flux. The cone angle and hence depth of the crucible is determined by the solid angle subtended by the cell orifice and substrate peripheries. The depth limits the cell volume and places the melt surface of a full crucible near the crucible orifice, where themelt temperature is sensitive to the shutter position.

Flux transients can also be reduced by the use of partially filled crucibles so that the influence of changes in the radiative shielding provided by the shutter are reduced. This approach is impractical as the reduced charge volume limits machine operation times between cell recharging. Schaff (Dr. W. Schaff Ph.D. Dissertation, Cornell University, 1984) has found that partially filled deep crucibles, shown in FIG. 2B, exhibit a smaller flux transient while retaining a large volume. This is because the melt temperatures deep within the furnace are less sensitive to changes in radiation shielding at the cell orifice. Deep crucibles tend to collimate the beam, however, which limits uniformity.

Accordingly, it is an object of the invention to provide an improved cruciblel for the production of molecular beams in a molecular beam epitaxial (MBE) system.

It is still another object of the invention to provide a crucible for the production of molecular beams in an MBE system having improved melt capacity while providing a uniform beam and low flux transient behavior.

It is an additional object of the present invention to provide an improved method of beam formation in an MBE system.

These and other objects of the invention are achieved in a novel crucible for use in a molecular beam expitaxial (MBE) system.

The crucible comprises an outer member of refractory material of relatively large volume for supporting a relatively large quantity of melt at a substantial depth, and an inner member of refractory material, set within the outer member, of a generally conical cross-section, having a large opening oriented toward a substrate supported for rotation within the MBE equipment and a small opening oriented toward the melt.

The outer member, given the limited internal dimensions of the furnaces of an MBE system, permits the melt to be disposed at an increased distance from the substrate and the inner member provides an additional radiation barrier to reduce the thermal transient which occurs when the shutter is operated. The dimensions of the inner member are selected to expose a substantially constant melt area to all points across the substrate at a given level of melt, and a slightly increasing exposed melt area as the level of melt falls in the outer member. These provisions lead to greater flux uniformity over the substrate surface and over processing time.

In accordance with another aspect of the invention, the area of melt exposed to the substrate via the inner member is from one-third to one-fifth the total melt area to reduce heat loss and regulate the exposed melt area while avoiding formation of a vapor equilibrium over the melt.

The inner conical member is designed such that the solid angle is substantially equal to the solid angle subtended by the substrate from a circular locus of point sources on the melt in positions adjacent the perimeter of the small opening of the conical member. This minimizes molecular or atomic trajectories completed to the substrate if a prior deflection by the conical member has occurred.

BRIEF DESCRIPTION OF THE DRAWINGS

The inventive and distinctive features of the invention are set forth in the claims of the present application. The invention itself, however, together with further objects and advantages thereof, may best be understood by reference to the following description and accompanying drawings, in which:

FIG. 2A illustrating a design optimized for good beam uniformity but suffering from high flux transients and small melt capacity; and FIG. 2B illustrating a design having good (low) flux transient behavior and large melt capacity but suffering from poor beam uniformity;

DESCRIPTION OF THE PREFERRED EMBODIMENT

Figure 1:
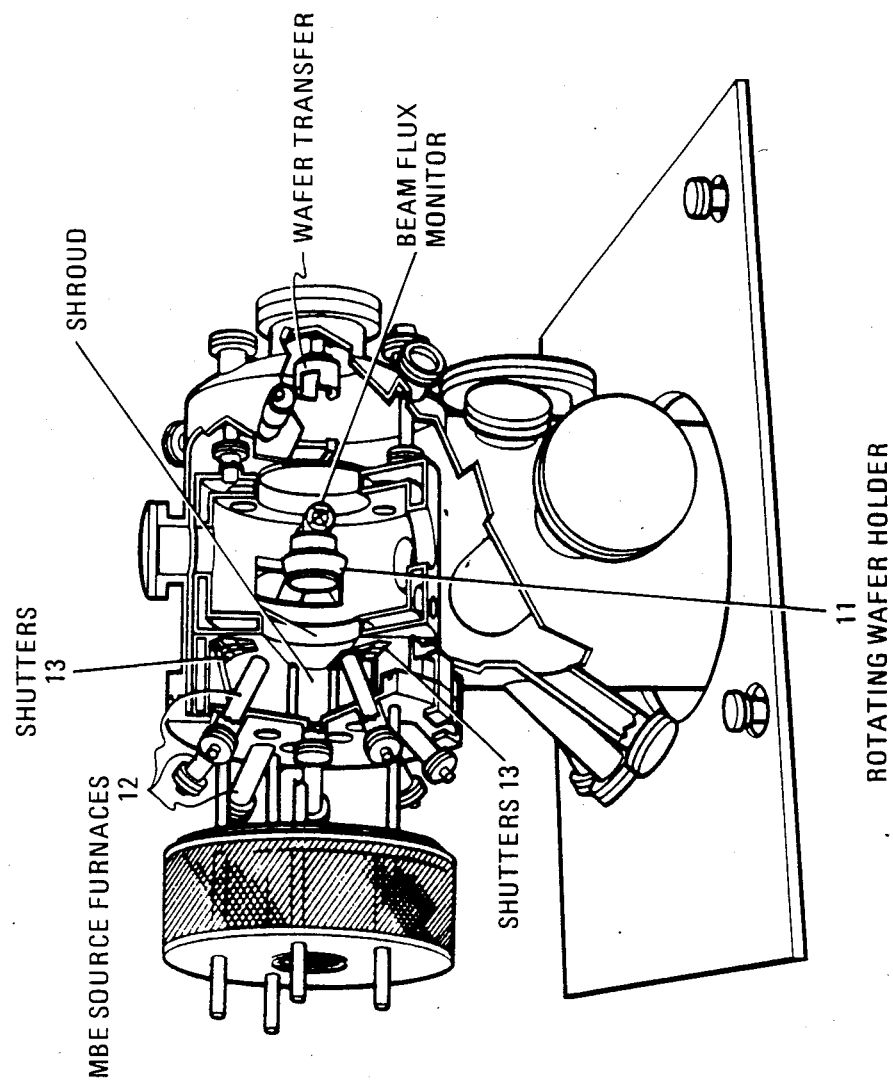
FIG. 1 is a portion of a molecular beam epitaxial (MBE) system illustrating the disposition of the substrate upon which the molecular beam impinges and the furnaces and shutters which control the beam.

Referring now to FIG. 1, a molecular beam epitaxial system (MBE) is shown in which the novel crucible finds application. In epitaxial processing, the crucible (not shown in FIG. 1), which contains a charge of semiconductor material, and which is heated by a surrounding furnace 12, forms a molecular or atomic effusion cell producing a molecular beam from evaporation of the charge. The procedure takes place in a high vacuum, and the substrate upon which the epitaxial layer is formed is maintained at an elevated temperature typically 600 degrees C. for GaAs to facilitate epitaxial growth.

The novel crucible has a relatively large capacity, reducing the frequency of system shut downs for recharging, and has a novel configuration facilitating beam uniformity, essential to good quality epitaxial processing. The novel configuration produces an improvement in beam uniformity by reducing the transient drop in the molecular flux, which occurs when a mechanical shutter near the crucible opens, initiating the improvement of the molecular beam on the substrate, and causing a sudden cooling at the surface of the charge. The novel configuration at the same time increases the uniformity of the molecular flux over the mouth of the crucible and thereby greater uniformity over the surface on which the epitaxial layer is being formed.

The MBE system, which is shown by a cutaway perspective drawing, has at its center a growth chamber that houses the substrate upon which the epitaxial layer will be formed. The substrate is typically a circular wafer cut from a boule; 2", 3", or 4" boules being used in the industry. After further processing, the circular wafer will be diced into individual integrated circuit chips. The substrate is supported on a continuously rotating wafer holder 11 disposed on and rotating about the horizontally disposed, central axis of the growth chamber. Means for heating the substrate, typically to a temperature of 600 degrees C. (for GaAs) are also provided.

The MBE system is designed to permit the formation of molecular beams for epitaxial processing from a variety of materials without the need to break the vacuum of the growth chamber. This flexibility is achieved by the provision of a plurality of furnaces 12, each containing a crucible, and each charged with an optionally different material.

The furnaces 12, are cylindrical members closed at one end and open at the other end. Collectively, they are arranged in a conical surface with the horizontal axis of the cone being coincident with the axis of the chamber. The opening of each furnace is directed toward the intersection of the chamber axis with the center of the wafer holder. The furnaces are arranged so that a crucible may be inserted into the open ends of each furnace. Each crucible is closed at one end, which extends into the furnace and opens at the other end from which the molecular beam originates. Positioning the open end of the crucible in the open end of the furnace, and in alignment with the axis of the furance permits the opening of the crucible to be directed toward the center of the wafer holder.

The furnaces, which are eight in number (in a known system) are electrically heated cylindrical chambers typically five to six inches long and three-fourths to one and a half inches in diameter. The furnaces are individually insulated so that they may reach temperatures required for the materials with which they are charged. The furnaces are designed for operation at temperatures as high as 1600 degrees C.

The temperature at the bottom of the crucible is closely controlled by a thermocouple set within each furnace, and in contact with the bottom of each crucible. The thermocouple is the temperature sensor in a temperature regulating system controlling the energy supplied to the furnace to maintain the temperature at the bottom of the crucible at a constant temperature.

The temperature at the surface of the charge within the crucible is a very significant factor in determining the rate of flux production in the molecular beam. The temperature at the surface of the charge, however, is not directly regulated since significant thermal impedance may exist between the bottom of the crucible and the surface of the charge.

Figure 4:
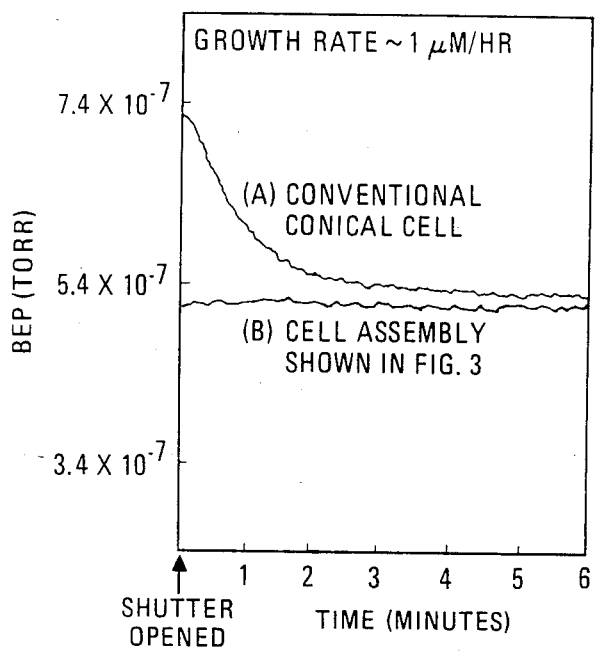
FIG. 4 illustrates the flux transient behavior of a conventional conical crucible, as opposed to one embodiment of the invention.

Changes in the thermal environment affect the surface temperature and thereby the effusion rate. In a typical case, the effusion rate may fall by 30% over a period of several minutes as shown in FIG. 4, by the opening of a mechanical shutter associated with that furnace. Mechanical shutters are used to control the time duration of the effusion process. Each furnace is provided with a shutter 13 which slides into a position closing the opening of the furnace and preventing further effusion. The shutters 13 are operated so that only those furnaces required for conducting one operation are unshuttered at any one time. Typically, two to four furnaces are in operation at one time.

A preferred crucible material is pyrolytic boron nitride (PBN), suitable for operation to 1600 degrees C. The crucible is formed in lamina by a high temperature process.

Figure 3:
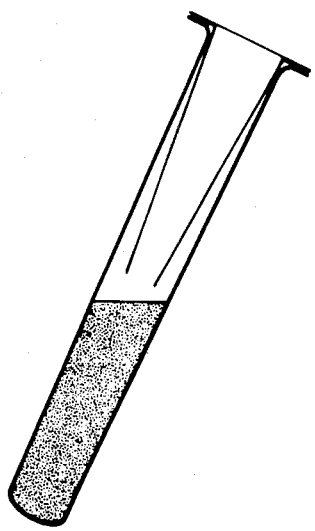
FIG. 3 illustrates an improved crucible in accordance with the invention for molecular beam formation having both good (low) flux transient behavior and excellent flux uniformity.
Figure 6:
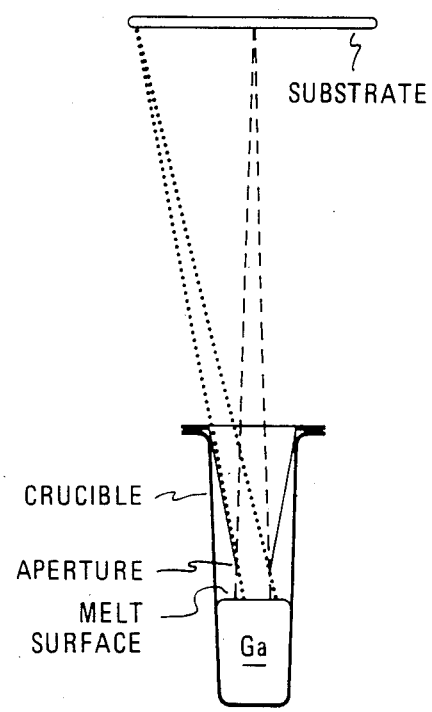
FIG. 6 illustrates the design principles applicable to achieving a uniform flux over the substrate.

A novel crucible for use in the FIG. 1 MBE system is shown in FIG. 3. The geometric considerations involved in the shape of the crucible are shown in FIG. 6, and the performance of the crucible is in part depicted in FIGS. 4 and 5.

The crucible, shown in FIG. 3, is designed to fit into one of the furnaces 12 illustrated in FIG. 1 and more particularly one of the four furnaces in which the closed end of the furnace is lower than the open end allowing liquids formed in the crucible to be supported at the closed back end of the crucible.

The crucible may be seen to consist of two parts providing both a deeply recessed chamber for the melt and a beam shaping conical member for maintaining flux uniformity. The outer member 14 is of refractory material (PBN), of relatively large volume, and of substantial depth so as to contain a relatively large quantity of the melt. In a practical example, the nominal volume of the crucible is 40 CC of which, approximately half is available for the melt. The walls of the outer member 14 taper slightly toward the back and the closed bottom is slightly curved, features which are dictated by the manufacturing process and not significantly relevant to crucible performance. The open end of 14 contains a flange designed to rest in the open mouth of the furnace.

The inner member 15 of the crucible is also of refractory material (PBN). It is set within the outer member and has a flanged opening designed to fit within the larger flanged opening of the outer member 14. When the two members are assembled together, the smaller opening nests into the larger opening of the furnace and a metallic member, not shown, holds the two members in alignment with the axis of the furnace and in engagement with the furnace opening. The inner member has a narrowing conical surface extending inward from the flanged end, until it reaches a reduced diameter of slightly under half the diameter of the outer member. The inner member 15 is open at the inner end to allow exposure of the surface of the melt to space outside the mouth of the furnace. The inner member, assuming the inner end is closed, has a nominal capacity of approximately 16 cc.

The novel crucible is normally filled to the extent shown in FIG. 1. Under normal charge conditions, the melt does not extend past the inner end of the inner member.

The role of the conical insert is to limit the trajectories of the molecular or atomic fluxes from the melt which can reach the substrate without wall collisions. Those molecules which impinge on the side of the exterior of the conical crucible tend to condense due to a lower crucible surface temperature near the end of the furnace. Thus the intensity of the molecular beam is determined largely by those molecular which escape the crucible without wall collisions. Therefore, the factor controlling the beam intensity is the exposed melt area.

While there is a trajectory limitation, an equilibrium Group III vapor (as in the Knudsen effusion cell) is not maintained over the melt because of the large size of the apertures.

The conical dimensions of the inner member 15 are established by the construction illustrated in FIG. 6. The purpose of the design is to have the aperture of the crucible insert (15) present a constant melt area to all points across the two inch wafer. Because the aperture size and position is defined by the conical insert, the unobstructed melt area within the angle of the cone is substantially constant as long as the projection of the aperture lies on the melt surface.

In the FIG. 6 arrangement, the two inch wafer is shown spaced somewhat closer than to actual scale from the cruciblre. (The illustration does not deal with the angle of incidence of the center of the beam with the wafer. That angle is less than 90 degrees—typically about 60 degrees.) For the optimum design, the solid angle of the conical member 15 is approximately equal to the solid angle intercepted by the two inch wafer from any point on the surface of the melt. This constraint exposes approximately the same amount of melt surface to any point on the substrate whether on axis or towards the perimeter. This equality will be true when the crucible is filled to approximately the lower edge of the inner opening of the member 15. This is true because every point on the wafer will see a circular area equal to the diameter of the inner opening, unobscured by the inner walls of the conical surface 15. A deep crucible (40 CC) such as is shown in FIG. 2B produces such obscurance at large angles from the cell axis.

The geometry in fact increases the projected melt area as the melt is consumed and the melt surface withdraws more deeply into the outer container 14. Since the melt surface is several times larger (4 to 5 times in the illustrated example) than the inner opening, a slightly increasing area of the melt will continue to be exposed, until the melt is very near the bottom of the crucible, and no longer covers the bottom.

The angular uniformity of the beam depends only on the aperture size and position and the cell mouth size and the position relative to the substrate. A crucible insert which is not conical yet obeys the geometrical construction of FIG. 6 will also provide a uniform beam. In practice however, the central axis of the crucible is not aligned vertically, hence the conical insert is the optimum design for maximizing the crucible volume for liquid effusion materials.

The beam limiting aperture of the present crucible design does not adversely affect the trade-off between beam intensity and cell operating temperature. The crucible provides the same flux at 100 degrees C lower temperatures than a conventional 16 CC conical crucible. The lowered temperature is an indication of a smaller temperature drop through the melt, and a greater (and better) thermal impedance between the surface of the melt and the opening of the crucible.

Figure 5:
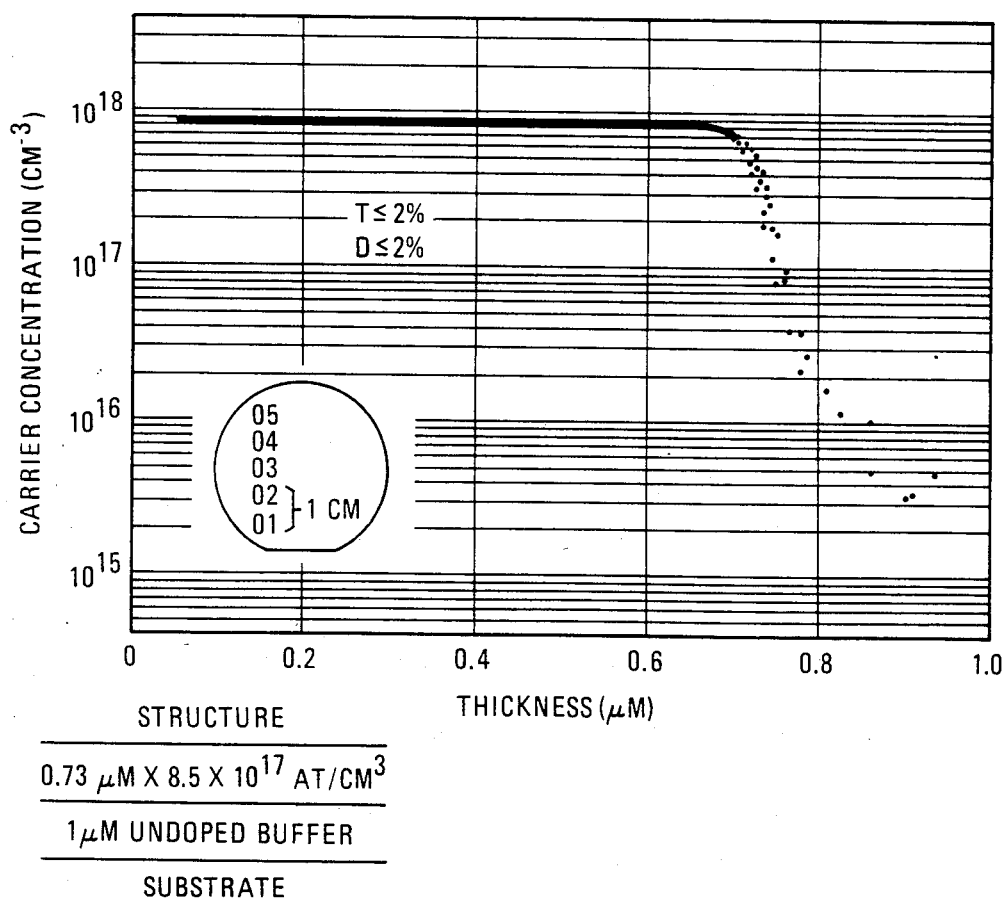
FIG. 5 illustrates the uniformity of carrier concentration and film thickness produced by a crucible of the present invention.

The other measurements indicative of the actual performance of the crucible are illustrated in FIGS. 4 and 5. The temporal flux transient is reduced by the present construction to approximately 5% over four minutes following the opening of the shutter from 32% over the same time period for the FIG. 2A design. This curve was obtained by plotting the beam equivalent pressure for Gallium by a beam flux monitor placed in promixity to the wafer as illustrated in FIG. 1. The low flux transient was obtained when the cell was fully charged. This is a worst case condition for a conventional conical cell, where the transient behavior is generally poor, improving slightly as the crucible empties. The reasons for the observed constancy of the flux and reduction of the temporal transient are believed to be the nearly constant or slightly increased exposed area as the crucible is emptied due to the recessed aperture of the conical crucible insert which controls beam uniformity, the greater depth of the melt within the furnace that the larger containing member permits, and the radiation shielding effect of the beam shaping inner member, which hold the temperature of the melt at the surface more nearly constant in spite of changes with radiation shielding as the shutter is operated.

The uniformity map of a silicon doped GaAs film grows on a two inch diameter substrate is shown in FIG. 5. The carrier concentration was targeted at 8.5 times $10^{17}$ atoms per $CM^3$. The observed variation in doping and thickness is less than ±2%. The uniformity of the film growth rate using a fixed thermostatic setting (at the bottom of the crucible) has been observed to continue for as much as 300 microns of total film growth. The long term stability reflects both the temperature stability and uniformity deep within the furnace and the flux control provided by the aperture.

The results of Hall measurements at 300 K and 77 K are reported in Table I for a lightly doped n-type GaAs film of 15 micron thickness.

TABLE I

| Temperature (K) | Hall cm² Mobility V-s | Hall Electron Concentration (# atoms/cm³) |
|---|---|---|
| 300 | 7,870 | 1 × 10¹⁴ |
| 77 | 129,900 | 1 × 10¹⁴ |

Figure 2A:
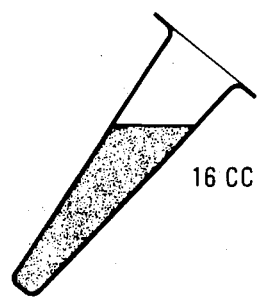
FIGS. 2A and 2B illustrate two crucibles of known design for beam formation in a molecular beam epitaxial (MBE) system.
Figure 2B:
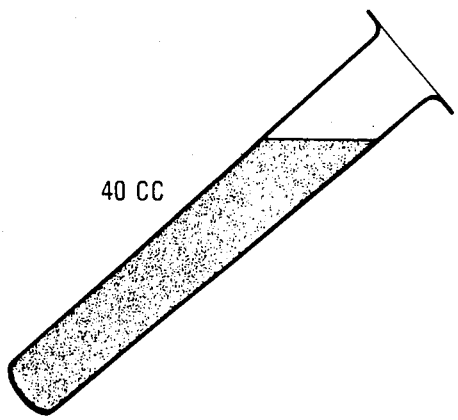

These results are equivalent to those normally obtained in a machine using the conventional 16 CC conical crucible cell of FIG. 2A.

The addition of the crucible insert has not reduced the purity of the GaAs grown using the new gallium source, as shown by the high 77 K electron mobility reported in Table I. This result is typical of state of the art MBE material and is equivalent to the results obtained in our machine using the conventional 16 CC conical crucible cell.

Oval defect densities are an important factor which can limit the yield of monolithic circuits fabricated on MBE grown GaAs. The oval defect density has been found to be lower using the two member crucible as compared to the conventional conical crucible.

What is claimed is:

1. A crucible for the production of uniform molecular beams from a melt with flow flux transient behavior and excellent flux uniformity in a molecular beam epitaxial (MBE) system for forming an epitaxial layer on a substrate:
   said crucible having a first opening for passage of said molecular beam, and comprising:
   (1) an outer member of refractory material of relatively large volume for supporting a relatively large quantity of said melt at a substantial depth, and
   (2) an inner member of refractory material, set within said outer member, having a small second opening oriented toward said melt, and defining with said first opening a generally conical passage for said molecular beam,
   said outer member permitting said melt to be disposed at an increased distance from said substrate and said inner member providing an additional radiation barrier to reduce said transient, the dimensions of said inner member being selected to expose a substantially constant melt area to all points across the substrate at a given level of melt, and a slightly increasing exposed melt area as the level of melt falls in the outer member for greater flux uniformity over the substrate surface and over time.

2. The crucible set forth in claim 1 wherein the area of said melt exposed to said substrate via said inner member is substantially less than the total melt area to reduce heat loss and regulate the exposed melt area while avoiding formation of a vapor equilibrium over said melt.

3. The crucible set forth in claim 1 wherein the area of said melt exposed to said substrate via said inner member is from one-third to one-fifth the total melt area to reduce heat loss and regulate the exposed melt area while avoiding formation of a vapor equilibrium over said melt.

4. The crucible set forth in claim 3 wherein the solid angle of said first and second openings are substantially equal to the solid angle subtended by said substrate from a circular locus of point sources on said melt and adjacent the perimeter of said small opening of said conical member to minimize molecular or atomic trajectories completed to said substrate following deflection by said crucible members.

5. The crucible set forth in claim 4 wherein said first and second openings are formed by a single conically shaped member.

* * * * *